United States Patent [19]

Bakos et al.

[11] 4,131,516
[45] Dec. 26, 1978

[54] METHOD OF MAKING METAL FILLED VIA HOLES IN CERAMIC CIRCUIT BOARDS

[75] Inventors: Peter Bakos; John Rasile, both of Endicott, N.Y.

[73] Assignee: International Business Machines Corporation, Armonk, N.Y.

[21] Appl. No.: 817,756

[22] Filed: Jul. 21, 1977

[51] Int. Cl.² .......................... C25D 5/02; C25D 7/04
[52] U.S. Cl. ..................................... 204/15; 204/38 B; 204/38 S; 427/97; 428/676
[58] Field of Search ................. 204/15, 26, 20, 38 R, 204/38 B, 38 S; 427/97, 96, 98; 428/670, 676, 935, 936, 939

[56] References Cited

U.S. PATENT DOCUMENTS

| 2,872,391 | 2/1959 | Hauser et al. | 204/15 |
| 2,897,409 | 7/1959 | Gitto | 204/15 |
| 3,099,608 | 7/1963 | Radovsky et al. | 204/15 |

OTHER PUBLICATIONS

IBM, TDB, vol. 8, No. 11, Apr. 1966, pp. 1494, 1495.
IBM, TDB, vol. 12, No. 1, Jun. 1969, p. 198.
IBM, TDB, vol. 12, No. 5, Oct. 1969, p. 719.
IBM, TDB, vol. 14, No. 9, Feb. 1972, pp. 2691-2692.
IBM, TDB, vol. 15, No. 8, Jan. 1973, p. 2492.
IBM, TDB, vol. 19, No. 3, Aug. 1976, p. 838.
Metal Finishing Guidebook Directory, 1969, p. 297.

Primary Examiner—T. M. Tufariello
Attorney, Agent, or Firm—Gerald R. Gugger

[57] ABSTRACT

A ceramic substrate is provided with via holes and these holes are primed by first depositing a palladium coating to the inside surface of the holes and then depositing an iron film onto the palladium. The primed holes are then completely filled with copper to provide conductive connections between opposite surfaces of the substrate. On one side of the substrate, input/output connector pins are brazed to the copper fillings. On the other side, printed circuitry is applied to produce a circuit module.

5 Claims, 2 Drawing Figures

METHOD OF MAKING METAL FILLED VIA HOLES IN CERAMIC CIRCUIT BOARDS

BACKGROUND OF THE INVENTION

In the production of printed circuit boards, solid circuits are formed of a conductive material such as a foil positioned on opposite sides of a boardlike insulating base. In order that electrical connections may be established from the circuit made by the conductor on one side of the board to the conductor on the other side of the non-conductive board, it is common practice to form holes through the conductive sheets and insulating board and to conductively connect these sheets through these holes. These holes are called "through holes" or via holes and the connections may be by mechanical means such as rivets, eyelets or pins or by coating means such as electroplating a conductor on the surface of the via holes after first treating the non-conductive surface so that it may be electroplated.

The most widely used method of forming the connections is by electroplating copper. However, since the insulating board material is not receptive to electroplating, the inner surface of the via holes must first be treated or primed. A preferred method of doing this is by depositing a thin film of "conductivator" type metal such as palladium in colloidal form. A conductivator refers to a metal which is an activator and conductor at the same time, i.e. the metal has the combined functions of simultaneously acting as a conductor and catalyst or activator when placed on a dielectric base for subsequent electroplating while actually being a thin film composed of particles of colloidal or semi-colloidal size which film is substantially non-conductive. Metals which are considered conductivator type metals are metals which can be formed in liquid suspensions as colloids or semi-colloids, such as palladium or other metals capable of functioning in the same manner, i.e. copper, gold, silver, platinum, nickel, cobalt, and iron. An advantage in using palladium is its ability to strongly adhere to the dielectric or insulating board, as well as being very receptive to electroplating. Also, palladium is an auto-catalyst which means it will adhere to many different kinds of substrates.

This method of making electroplated connections in via holes in an insulator board, along with methods for putting metallized circuitry on the surface of the board, is fully described in U.S. Pat. No. 3,099,608, which issued July 30, 1963.

In the present art, integrated circuit chips are mounted on modules which involve either a metallized ceramic (MC) module or a metallized multilayer ceramic (MCL) module. The MC module is a single layer of metallurgy on the surface of a ceramic substrate with a limited extension to being made double sided because of the scarcity of wiring vias available. The MLC module has a layer of metallurgy on the surface of a ceramic substrate on which is superimposed dielectric, signal, and ground planes which are electrically interconnected by the plated via holes. These modules are provided with I/O pins which protrude from the bottom surface of the module and which plug into a printed circuit card or board to make electrical connection therewith. The I/O pins are mounted in the plated via holes in the module and the accepted practice is to bond them in the holes by means of solder. The solder connection may be made between the pins and the plated walls of the via holes or may take the form of solder globules which bond the ends of the I/O pins to the metallized surface of the module. If the solder is used between the pins and the walls of the via holes, the holes have to be made larger and this decreases the area available to receive the metallized circuitry and the mounting of circuit chips. If solder globules are used, they protrude onto the metallized surface of the module and this also decreases the area available for receiving metallized circuitry and the mounting of circuit chips. Also, the use of the protruding solder globules does not facilitate the manufacture of MLC modules because the superimposed dielectric and metallized layers are uneven which results in altering the electrical characteristics of the module.

Another disadvantage in using solder to fasten the I/O pins is that in the manufacture of these modules it is the accepted practice to use a low melt solder to bond the chip to the substrate, an intermediate melt solder to bond the ground planes, and a high melt solder to bond the I/O pins. When the I/O pins are plugged into a printed circuit card or board, they are soldered with a high melt solder. A problem arises when it is desired to make an engineering change wherein the module has to be removed. To remove the module, sufficient heat has to be used to melt the high melt solder to free the pins. This results in melting the low and intermediate solders and chips may fall out.

It became apparent that a method of providing conductive via holes and bonding of I/O pins was needed which did not involve the use of solder and wherein there would be no protrusions on the surface of the module which was to be metallized.

Attempts to provide such a method were tried by providing filled conductive via holes to which the ends of the I/O pins could be brazed. Filled conductive via holes have been proposed before. For example, one method involves the placing of silver balls over the via holes and melting the silver to fill the holes. However, it was found that this would not be feasible because the silver migrates and scatters causing short circuits. Also, it is highly corrosive. Another method is to fill the holes with a fine metallic powder. This does not result in a solid consistent filling and copper, which is preferred, does not adequately adhere to ceramic. Also, it has been proposed to use electrophoretic deposition of metal to fill the holes. However, this process does not use 100% pure metal and this introduces different electrical characteristics. Since copper is a preferred conductor, another method tried was to fill the previously described palladium plated via holes with melted copper. However, it was found that the temperature required to melt the copper, 900° C–1200° C, caused the palladium and the copper to diffuse into each other and there was not a sufficient amount of palladium left to adhere to the ceramic. It was also found that a copper filled via hole could not be satisfactorily produced by electroplating because the copper deposits in such a manner that a hole or void is left in the middle.

The problem presented, then, was to find a way of using the bonding characteristics of palladium and the conductive quality of copper to provide a filled via hole in a ceramic substrate.

SUMMARY OF THE INVENTION

The present invention solves the aforementioned problem by providing a primer coating between a plating of palladium on the inside wall of the via hole and a filler of copper. It was found that by using a primer coat of iron between the palladium and copper that an excellent metal filled via hole was obtained.

A ceramic substrate with drilled via holes is dip coated in palladium to palladium plate the inside walls of the via holes. Either iron sulfate or iron chloride is then plated onto the palladium using the electrolytic process. After the primer coat of iron is deposited, the remainder of the via holes are filled by melting copper into them. The palladium adheres strongly to the ceramic substrate and the iron adheres strongly to both the palladium and copper. The iron coat also acts as a barrier between the palladium and copper since it will not form an alloy with either palladium or copper. This makes it possible to use the high temperatures required to melt the copper with no detrimental effects to the overall bond. As a result, there is obtained a ceramic substrate having metal filled via holes and wherein the metal fillers are strongly bonded to the substrate and are capable of supporting I/O pins brazed to the bottom of them.

To complete the module, the substrate is machined to remove any excess metal and then metallized circuitry is formed on the top and bottom surfaces of the substrate using conventional methods. After metallization, I/O pins made of indium-copper-silver alloy are brazed to the bottom of the copper fillers in the via holes.

The present invention provides a number of advantages. In the aforementioned prior art, in order to get large enough solder balls to hold the I/O pins the internal diameter of the via holes had to be in the order of .025" - .030". By using the present method of brazing, via holes having a smaller internal diameter can be used and a greater I/O density can be obtained. Also, more area is available on the surface of the substrate and hence a greater printed circuitry density can be achieved and more circuit chips can be put on the substrate. The elmination of soldering also improved the manufacturing yield and greatly facilitates the making of engineering changes since low, intermediate, and high melt solders are not used.

Accordingly, a primary object of the present invention is to provide a novel and improved method for providing metal filled via holes in a ceramic substrate.

A further object of the present invention is to provide metal filled holes in a ceramic substrate by depositing a palladium coating to the inside surface of the holes, depositing an iron film onto the palladium, and filling the holes with copper.

A still further object of the present invention is to provide a printed circuit ceramic module having metal filled via holes to which I/O pins are brazed.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
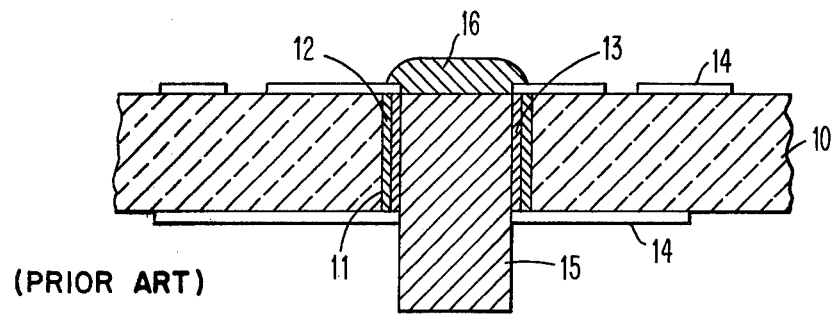
FIG. 1 illustrates in cross section the prior art method of retaining an I/O pin in a plated via hole by means of solder.

Referring to FIG. 1, there is illustrated the heretofore accepted printed circuit module and method of making the via hole connections in a ceramic substrate. The ceramic substrate 10 was provided with drilled via holes 11 and on the inside surface of these via holes there was deposited a thin coating of palladium 12 which adheres to the ceramic. On the coating of palladium is electroplated a thin plating of copper 13 which adheres to the palladium and provides conductive via connections between the top and bottom surfaces of the ceramic substrate. At least one, but usually both the top and bottom surfaces of the ceramic substrate have selectively deposited thereon metallized circuitry 14 which are conductively connected by the copper plating. To provide an external connection between the module and a printed circuit card or board, input-output (I/O pins) 15 are mounted in the plated via holes and retained therein by globules of solder 16 which bond the top of the pins to the top metallized surface of the substrate. It can be seen that the solder globule 16 not only decreases the area that can be metallized on the surface of the substrate but it also protrudes sufficiently upward from the surface to make it impractical to add an additional dielectric layer and a metallized layer if a multi-layer module is desired, since the additional layers would be uneven and the electrical characteristics of the module would be adversely affected.

Figure 2:
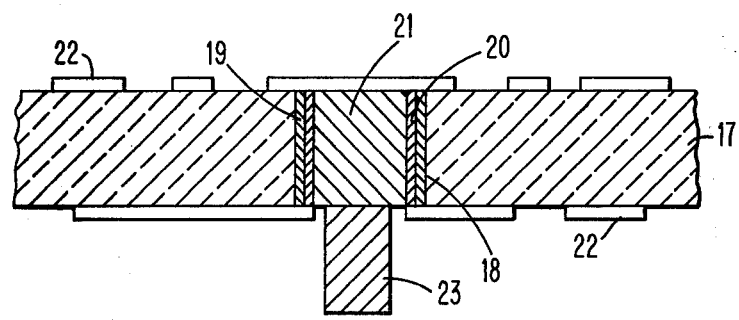
FIG. 2 illustrates in cross section a metal filled via hole having the I/O pin brazed thereto and prepared by the method of this invention.

Referring to FIG. 2, there is illustrated a printed circuit ceramic module constructed in accordance with the present invention. A ceramic substrate 17 is provided with drilled via holes 18. On the inside surface of the via holes 18 is deposited a thin coating of palladium 19 which will adhere strongly to the ceramic. The palladium is preferably prepared by dissolving Pd $(NH_3)_2$ $(NO_2)_2$ in allylamine with mild agitation and reacting at 40° C for 2 hours. During the reaction, the unshared electrons from $R-NH_2$ enter the coordination sphere of the $Pd^{+2}$ to form a new complex. The resultant compound may be sprayed, spun, or dip-coated to form a uniform microlayer on the inner substrate walls of the via holes. Dip coating is preferred to make sure that the palladium solution goes into the holes. The substrate is dipped into this palladium solution for 5 to 10 seconds after which the substrate is removed and hung to dry for one minute. The substrate is then baked at 100° C to 500° C under inert or ambient atmosphere and the palladium complex is decomposed to pure metal. The thickness of the palladium coating 19 may be between 25-150 micro-inches. In the interest of economy, the coating should be as thin as possible. As long as the coating is uniform, the thickness is not critical. The well-known electrolytic process could also be used to deposit the palladium.

Next, in accordance with the present invention, a film of iron 20 is plated onto the palladium by the electrolytic process. Iron sulfate ($FeSO_4$) or iron chloride ($FeCl_2$) solutions may be used. Iron sulfate is preferred since it is easier to change the pH to compensate for different substrate materials other than ceramic. One solution which will deposit a satisfactory film of iron onto the palladium comprises:

| | |
|---|---|
| Ferrous sulfate ($FeSO_4 \cdot 7H_2O$) | - 32 oz./gal. |
| Temperature | - 90 - 150° F. |
| Current Density, maximum | - 40 amp/sq. ft. at 90° F. |
| | 100 amp/sq. ft. at 150° F. |
| pH | - 2.8 - 3.5 |
| Surface tension | - 40 dynes/cm. |
| Cathode agitation is desirable. | |

Preferably the iron film should have a thickness of between 70-150 micro-inches in order to insure a non-porous film which will act as an effective barrier between the palladium and the copper.

After the film of iron 20 is plated onto the palladium coating 19, the remainder of the via holes are filled solid with copper 21. One preferred method for accomplishing this is to position copper balls over the via holes by well-known vibrating equipment. The substrate and copper balls are then refired in a furnace in inert or ambient atmosphere at 900° C-1200° C to melt the copper balls and fill the via holes. The time involved is approximately 130 minutes for heating and cooling operations. The furnace time is approximately 70 minutes. 45 minutes to get the furnace temperature up to the desired temperature and 25 minutes to heat the substrate at that temperature. Cooling is done by leaving the substrate in the furance for approximately one hour. This is desirable to prevent the ceramic from cracking.

If desired, a copper sheet or copper powder could be melted to fill the via holes using the same cycle procedure.

After the via holes have been filled with copper, the substrate is machined by grinding and lapping to remove any excess metal and prepare the substrate for circuit metallization.

The circuit metallization 22 may be deposited on both the top and bottom surfaces of the substrate by any of the known conventional techniques. For example, Cr/Cu/Cr may be deposited on the top and bottom surfaces of the substrate. This is followed by conventional photoengraving and etching operations. To make a multi-layer module, a dielectric sheet would be deposited onto the metallized top surface of the substrate followed by further metallization, photoengraving and etching.

The module is now ready to have the I/O pins 23 attached thereto. The pins are preferably indium-copper-silver and they are aligned with the bottom of the via holes by means of a suitable fixture and the assembly is put into a furnace. The furnace temperature is put at approximately 650° C to reflow the pins and braze or fuse the ends of the pins to the ends of the copper fillers 21.

Following the brazing of the I/O pins, the module would be completed by attaching circuit chips and encapsulating the unit. It can be seen that the elmination of the protruding solder globules makes it possible to attach more circuit chips to the surface of the module since the chips may be mounted directly over the via filled holes.

It will be understood that although the present preferred embodiment is directed to the use of a ceramic substrate, other inorganic substrate materials could be used just as well. Also, the preferred embodiment uses iron as the primer coat between the palladium and the melted copper; however, other metals could be used which do not diffuse with the palladium and copper.

While there have been shown and described and pointed out the fundamental novelty features of the invention as applied to the preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A method of making conductive connections in via holes in printed circuit boards which comprises;
    depositing in the via holes a thin film of palladium metal;
    depositing a primer coat of a thin film of iron on said palladium film; and
    completely filling the primed via holes with copper to provide conductive connections between opposite surfaces of a printed circuit board.

2. A method as defined in claim 1 and including brazing indium-copper-silver input-output connector pins to the ends of the copper connections on one side of the board.

3. A method of making conductive connections in via holes in a ceramic substrate which comprises;
    dip coating in the via holes a thin film of palladium metal;
    electrolytically depositing a primer coat of a thin film of iron on said palladium film; and
    melting copper to completely fill the primed via holes to provide conductive connections between opposite surfaces of said ceramic substrate.

4. The method defined in claim 3 and further including;
    selectively depositing metallized circuitry on at least one surface of said ceramic substrate; and
    brazing input-output connector pins to the ends of the copper connections on one side of the ceramic substrate.

5. A method of making conductive connections in via holes in a ceramic substrate which comprises;
    depositing in the via holes a thin film of palladium metal having a thickness of 25-150 micro-inches;
    depositing a primer coat of a thin film of iron on said palladium film, said iron film having a thickness of 70-150 micro-inches so that it is non-porous; and
    melting copper to completely fill the primed via holes to provide conductive connections between opposite surfaces of said ceramic substrate.

* * * * *